(12) United States Patent
Bao et al.

(10) Patent No.: US 12,713,692 B2
(45) Date of Patent: Aug. 18, 2026

(54) RECESSED THROUGH-DIE VERTICAL INTERCONNECT ACCESSES TO BACK-SIDE POWER DISTRIBUTION NETWORKS AND RELATED METHODS

(71) Applicant: QUALCOMM Incorporated, San Diego, CA (US)

(72) Inventors: Junjing Bao, San Diego, CA (US); John Jianhong Zhu, San Diego, CA (US); Abhishek Jain, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 364 days.

(21) Appl. No.: 18/442,236

(22) Filed: Feb. 15, 2024

(65) Prior Publication Data

US 2025/0267932 A1 Aug. 21, 2025

(51) Int. Cl.

| | |
|---|---|
| ***H10D 84/83*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10W 20/41*** | (2026.01) |

(52) U.S. Cl.

CPC ........... *H10D 84/83* (2025.01); *H10D 30/014* (2025.01); *H10D 30/43* (2025.01); *H10D 30/6735* (2025.01); *H10D 30/6757* (2025.01); *H10D 62/118* (2025.01); *H10D 64/017* (2025.01); *H10D 84/0149* (2025.01); *H10D 84/038* (2025.01); *H10W 20/427* (2026.01)

(58) Field of Classification Search

CPC .. H10D 84/83; H10D 30/6757; H10W 20/427

See application file for complete search history.

(56) References Cited

U.S. PATENT DOCUMENTS

| | | | | |
|---|---|---|---|---|
| 2018/0108737 A1* | 4/2018 | Naito | .................. | H10D 84/811 |
| 2021/0343684 A1* | 11/2021 | Kim | ....................... | H10D 1/692 |
| 2023/0187491 A1* | 6/2023 | Wang | ................ | H10D 30/6757 257/192 |
| 2023/0290821 A1* | 9/2023 | Cheng | ............... | H10D 30/6735 |

* cited by examiner

*Primary Examiner* — Steven M Page

(74) *Attorney, Agent, or Firm* — Withrow & Terranova, PLLC

(57) ABSTRACT

Deep vias may be employed on a die to connect transistor circuits on a front side to a power distribution network on a back side. Deep vias extending from a second die surface to a first die surface over an entire length may have high resistance interfaces to circuit interconnects that couple the deep vias to transistor circuits. Deep vias adjacent to transistor channel regions in the transistor circuits may also cause unwanted capacitance. An exemplary deep via includes an interface region and at least one non-interface region, where the interface region includes an interface between the deep via and a circuit interconnect, and the at least one non-interface region extends a second distance that is less than the distance between the first die surface and the second die surface. In this manner, capacitance is reduced, and resistance may be reduced.

20 Claims, 11 Drawing Sheets

Figure 3:
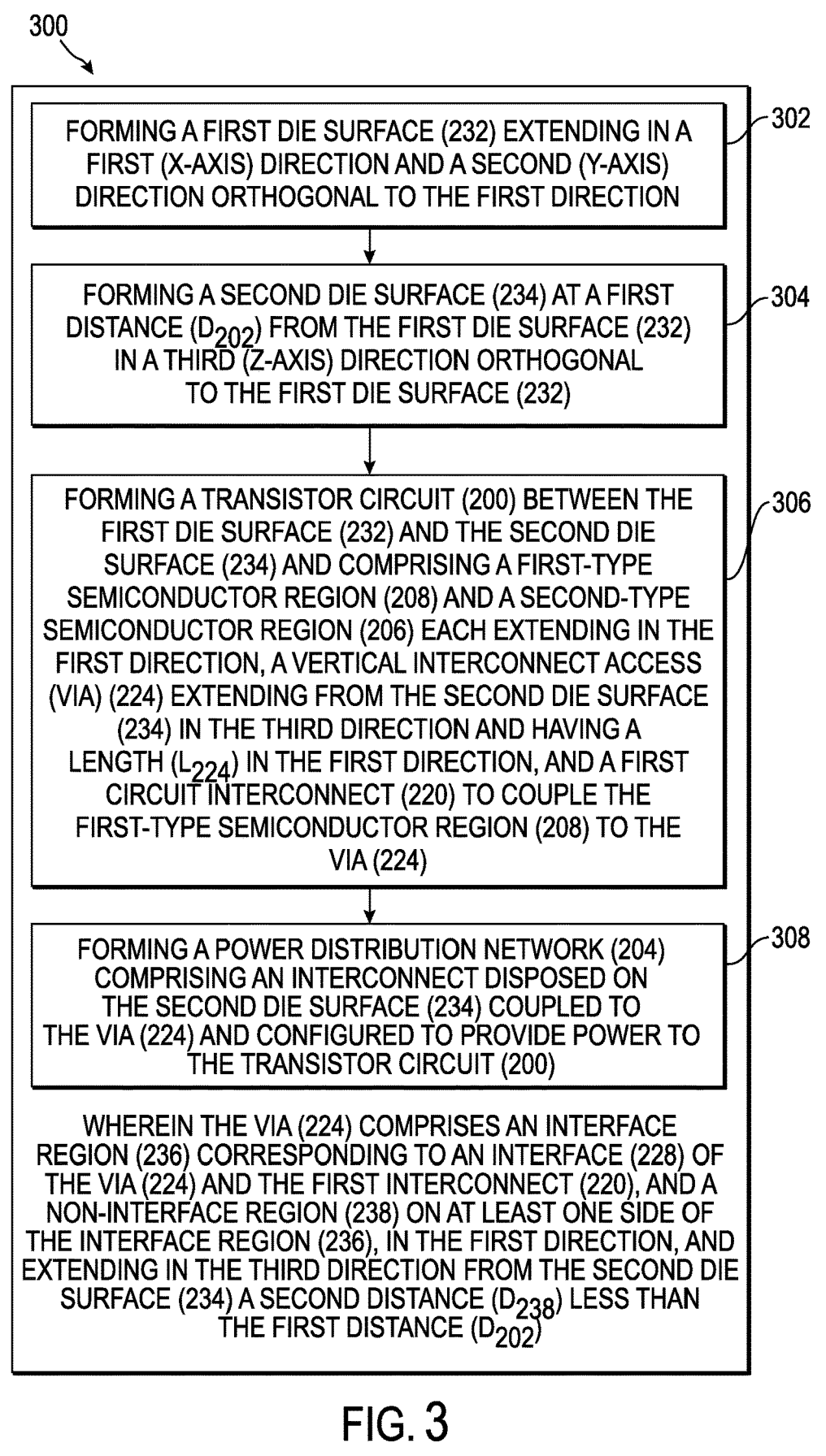

300

302: FORMING A FIRST DIE SURFACE (232) EXTENDING IN A FIRST (X-AXIS) DIRECTION AND A SECOND (Y-AXIS) DIRECTION ORTHOGONAL TO THE FIRST DIRECTION

304: FORMING A SECOND DIE SURFACE (234) AT A FIRST DISTANCE ($D_{202}$) FROM THE FIRST DIE SURFACE (232) IN A THIRD (Z-AXIS) DIRECTION ORTHOGONAL TO THE FIRST DIE SURFACE (232)

306: FORMING A TRANSISTOR CIRCUIT (200) BETWEEN THE FIRST DIE SURFACE (232) AND THE SECOND DIE SURFACE (234) AND COMPRISING A FIRST-TYPE SEMICONDUCTOR REGION (208) AND A SECOND-TYPE SEMICONDUCTOR REGION (206) EACH EXTENDING IN THE FIRST DIRECTION, A VERTICAL INTERCONNECT ACCESS (VIA) (224) EXTENDING FROM THE SECOND DIE SURFACE (234) IN THE THIRD DIRECTION AND HAVING A LENGTH ($L_{224}$) IN THE FIRST DIRECTION, AND A FIRST CIRCUIT INTERCONNECT (220) TO COUPLE THE FIRST-TYPE SEMICONDUCTOR REGION (208) TO THE VIA (224)

308: FORMING A POWER DISTRIBUTION NETWORK (204) COMPRISING AN INTERCONNECT DISPOSED ON THE SECOND DIE SURFACE (234) COUPLED TO THE VIA (224) AND CONFIGURED TO PROVIDE POWER TO THE TRANSISTOR CIRCUIT (200)

WHEREIN THE VIA (224) COMPRISES AN INTERFACE REGION (236) CORRESPONDING TO AN INTERFACE (228) OF THE VIA (224) AND THE FIRST INTERCONNECT (220), AND A NON-INTERFACE REGION (238) ON AT LEAST ONE SIDE OF THE INTERFACE REGION (236), IN THE FIRST DIRECTION, AND EXTENDING IN THE THIRD DIRECTION FROM THE SECOND DIE SURFACE (234) A SECOND DISTANCE ($D_{238}$) LESS THAN THE FIRST DISTANCE ($D_{202}$)

FORMING A FIRST DIE SURFACE (832) EXTENDING IN A FIRST (X-AXIS) DIRECITON AND A SECOND (Y-AXIS) DIRECTION ORTHOGONAL TO THE FIRST (X-AXIS) DIRECTION AND A SECOND DIE SURFACE (834) AT A FIRST DISTANCE ($D_{802}$) FROM THE FIRST DIE SURFACE (832) IN A THIRD DIRECTION ORTHOGONAL TO THE FIRST DIE SURFACE (832), AND FORMING A TRANSISTOR CIRCUIT (804) BETWEEN THE FIRST DIE SURFACE (832) AND THE SECOND DIE SURFACE (834) AND COMPRISING A FIRST-TYPE SEMICONDUCTOR REGION (808) AND A SECOND-TYPE SEMICONDUCTOR REGION (806) EACH EXTENDING IN THE FIRST DIRECTION, AND A VIA (824) EXTENDING FROM THE SECOND DIE SURFACE (834) IN THE THIRD DIRECTION AND HAVING A LENGTH ($L_{824}$) IN THE FIRST DIRECTION.

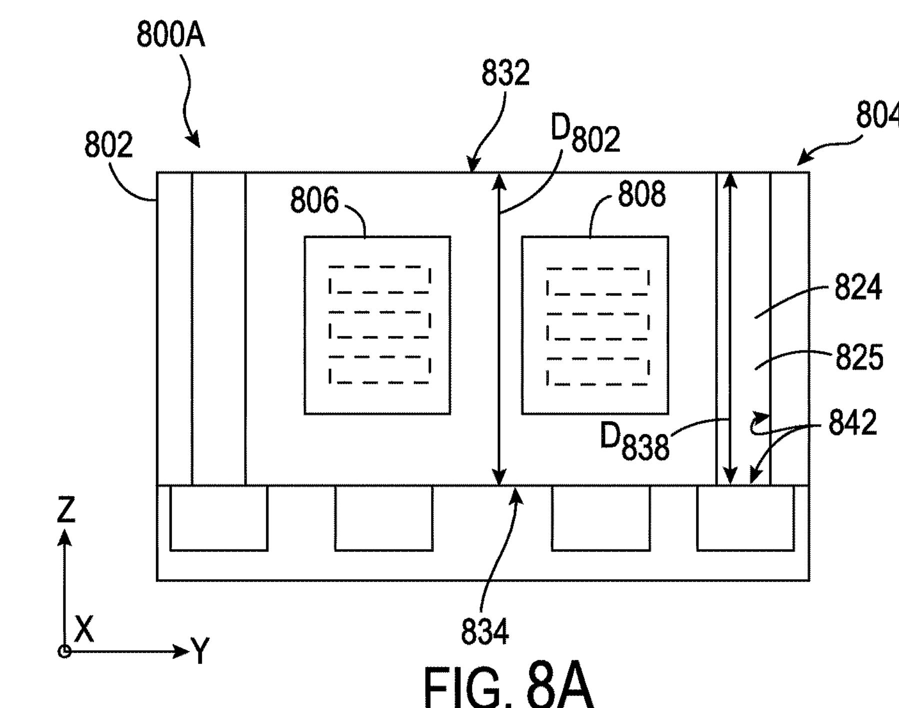

FIG. 8A

RECESSED THROUGH-DIE VERTICAL INTERCONNECT ACCESSES TO BACK-SIDE POWER DISTRIBUTION NETWORKS AND RELATED METHODS

BACKGROUND

I. Field of the Disclosure

The technology of the disclosure relates generally to integrated circuit dies and, more particularly, to improved power distribution network interconnects.

II. Background

Performance improvements in electronic devices driven by consumer demand motivate manufacturers of electronic components to make integrated circuits (ICs) smaller with each new generation. One improvement that has been made to ICs as their sizes have been reduced is to provide power to transistor circuits on a front side of the die from a power distribution network on a back side of the die. A connection between the power distribution network on the back side and the transistor circuits on the front side may be achieved by an interconnect referred to herein as a "through-chip" or "through-die" vertical interconnect access (via), also known as a "deep via," because it extends from circuits on the front side of a semiconductor die and through the die a power distribution network on the back side. The electrical characteristics of a deep via can be a factor in performance of the transistor circuits on a die and every transistor operating in a circuit needs a connection to a power source, which means that any negative characteristics of such deep vias may be multiplied thousands of times in an IC. Thus, any improvements to deep vias to avoid negative characteristics are desirable.

SUMMARY

Aspects disclosed in the detailed description include recessed through-die vertical interconnect accesses (vias) to back-side power distribution networks. Related methods of manufacturing recessed through-die vias are also disclosed. An integrated circuit (IC) die or chip having transistor circuits on a first side may include through-die ("deep") vias connecting the transistor circuits to a power distribution network on a second, back side of the IC die. Deep vias that extend a first distance from a second die surface to a first die surface over an entire length of the deep via may have high resistance interfaces to circuit interconnects that couple the deep vias to transistor circuits. Deep vias adjacent to transistor channel regions in the transistor circuits may also cause unwanted capacitance. In an exemplary IC die, a deep via includes an interface region and at least one non-interface region, where the interface region includes an interface between the deep via and a circuit interconnect, and the at least one non-interface region extends a second distance that is less than the first distance from the second die surface. In this manner, capacitance in a transistor circuit may be reduced. In some examples, resistance of the interface between the deep via and the circuit interconnect may also be reduced due to the deep via being recessed in the interface region. In some examples, the deep via is recessed in the interface region and the non-interface region. In some examples, the at least one non-interface region of the deep via is reduced to extend a distance in a range of 25% to 75% of the first distance between the first die surface and the second die surface.

In this regard, in one exemplary aspect, an integrated circuit (IC) die is disclosed. The IC die includes a first die surface extending in a first direction and a second direction orthogonal to the first direction, and a second die surface at a first distance from the first die surface in a third direction orthogonal to the first die surface. The IC die further includes a transistor circuit between the first die surface and the second die surface and includes a first-type semiconductor region and a second-type semiconductor region, each extending in the first direction, a vertical interconnect access (via) extending from the second die surface in the third direction and having a length in the first direction, and a first interconnect configured to couple the first-type semiconductor region to the via. The IC die also includes a power distribution network comprising an interconnect disposed on the second die surface coupled to the via, wherein the via includes an interface region corresponding to an interface of the via and configured to provide power to the transistor circuit, and the first interconnect and a non-interface region on at least one side of the interface region in the first direction and extending in the third direction from the second die surface a second distance less than the first distance.

In another exemplary aspect, a method of fabricating an integrated circuit (IC) die is disclosed. The method includes forming a first die surface extending in a first direction and a second direction orthogonal to the first direction and forming a second die surface at a first distance from the first die surface in a third direction orthogonal to the first die surface. The method further includes forming a transistor circuit between the first die surface and the second die surface and including a first-type semiconductor region and a second-type semiconductor region, each extending in the first direction, a vertical interconnect access (via) extending from the second die surface in the third direction and having a length in the first direction, and a first interconnect configured to couple the first-type semiconductor region to the via. The method further includes forming a power distribution network comprising an interconnect disposed on the second die surface coupled to the via and configured to provide power to the transistor circuit wherein the via includes an interface region corresponding to an interface of the via and the first interconnect and a non-interface region on at least one side of the interface region in the first direction and extending in the third direction from the second die surface a second distance less than the first distance.

BRIEF DESCRIPTION OF THE DRAWINGS

FIG. 3 is a flowchart of an exemplary fabrication process of fabricating the IC die shown in FIGS. 2A-2D, including a deep via to couple a transistor circuit to a back-side PDN, the deep via recessed in at least one non-interface region to reduce interface resistance to a circuit interconnect and to reduce capacitance to a first-type semiconductor region;

FIGS. 7A-7C are a flowchart illustrating another exemplary fabrication process of fabricating an exemplary IC die including an exemplary transistor circuit including a deep via to couple a transistor circuit to a back-side PDN wherein at least one region of the deep via is recessed below a first die surface;

FIGS. 8A-8C are exemplary fabrication stages during the fabrication of an exemplary transistor circuit on an exemplary IC die, including a deep via to couple a transistor circuit to a back-side PDN wherein at least one region of the deep via is recessed below a first die surface in FIGS. 7A-7C;

DETAILED DESCRIPTION

Figures 1A, 1B, 1C, 1D:
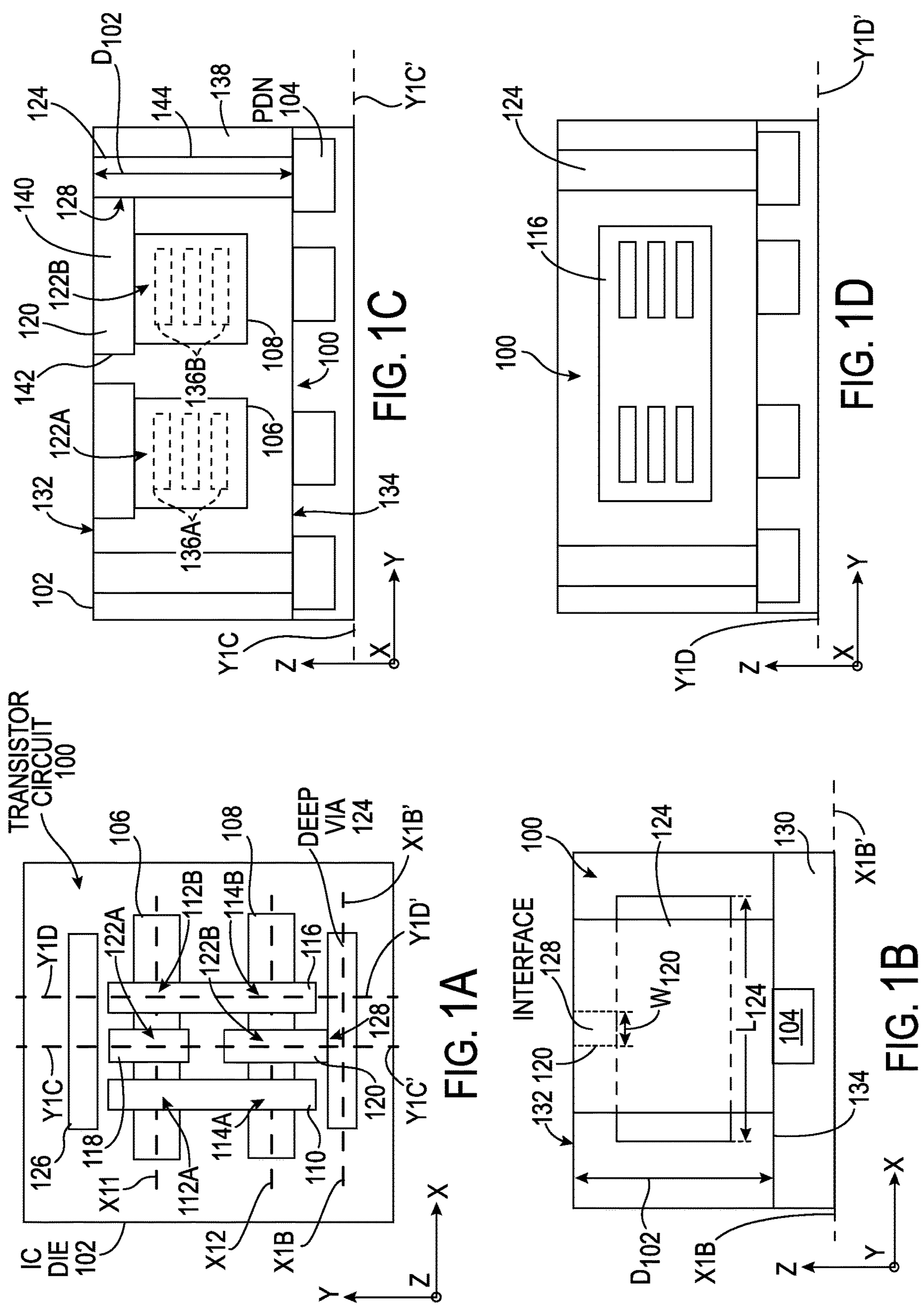
FIGS. 1A-1D are cross-sectional views along Z, Y, and X axes, respectively, of a conventional transistor circuit in a cell circuit layout on an integrated circuit (IC) die, including a through-die via extending from a first die surface to a second die surface to couple a circuit interconnect to a back-side power distribution network.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include recessed through-die vertical interconnect accesses (vias) to back-side power distribution networks. Related methods of manufacturing recessed through-die vias are also disclosed. An integrated circuit (IC) die or chip having transistor circuits on a first side may include through-die ("deep") vias connecting the transistor circuits to a power distribution network on a second, back side of the IC die. Deep vias that extend a first distance from a second die surface to a first die surface over an entire length of the deep via may have high resistance interfaces to circuit interconnects that couple the deep vias to transistor circuits. Deep vias adjacent to transistor channel regions in the transistor circuits may also cause unwanted capacitance. In an exemplary IC die, a deep via includes an interface region and at least one non-interface region, where the interface region includes an interface between the deep via and a circuit interconnect, and the at least one non-interface region extends a second distance that is less than the first distance from the second die surface. In this manner, capacitance in a transistor circuit may be reduced. In some examples, resistance of the interface between the deep via and the circuit interconnect may also be reduced due to the deep via being recessed in the interface region. In some examples, the deep via is recessed in the interface region and the non-interface region. In some examples, the at least one non-interface region of the deep via is reduced to extend a distance in a range of 25% to 75% of the first distance between the first die surface and the second die surface.

FIGS. 1A through 1D are views of a transistor circuit 100 on an integrated circuit (IC) die 102 shown along each of the Z, Y, and X axes. The transistor circuit 100 is arranged in a standard cell circuit layout on the IC die 102 as shown in a top plan view in the Z-axis direction in FIG. 1A. Before discussing the conventional via employed in the transistor circuit 100 for coupling the transistor circuit 100 to a power distribution network (PDN) 104 (see FIG. 1B), features of the transistor circuit 100 are first described in detail.

In FIG. 1A, the illustration is a cross-sectional top view of the transistor circuit 100 including a second-type semiconductor region 106 and a first-type semiconductor region 108 in which transistors are formed. The second-type semiconductor region 106 and the first-type semiconductor region 108 extend along longitudinal axes X11 and X12, which extend in a first (X-axis) direction. The second-type semiconductor region 106 includes semiconductor material (see FIG. 1C) doped to have either P-type channels or N-type channels, and the first-type semiconductor region 108 is doped to form either N-type channels or P-type channels, opposite to the second-type semiconductor region 106, as known in the art. The transistor circuit 100 includes a gate 110, which is disposed on channel region 112A of the second-type semiconductor region 106 and on channel region 114A of the first-type semiconductor region 108. A gate 116 is disposed on channel region 112B of the second-type semiconductor region 106 and on channel region 114B of the first-type semiconductor region 108. The transistor circuit 100 also includes circuit interconnects 118 and 120, which are coupled to source/drain regions 122A and 122B, respectively. Thus, the transistor circuit 100 may be employed to form complementary metal oxide semiconductor (CMOS) transistor circuits.

The circuit interconnect 120 in this example is employed to provide a voltage to the source/drain region 122B. In this regard, the circuit interconnect 120 extends along a longitudinal axis Y1C in a second (Y-axis) direction and abuts a deep via 124, having an interface 128 including an electrical connection to electrically couple the deep via 124 and the source/drain region 122B. The circuit interconnect 118 may be employed to provide a voltage to the source/drain region 122A and, in some examples, may be coupled to a deep via 126. The deep via 124 extends along a cross-section X1B-X1B'.

The deep via 124 may receive a supply voltage $V_{DD}$ or a reference voltage $V_{SS}$ (not shown), for example, from the PDN 104. FIG. 1B is a view of the transistor circuit 100 from the Y-axis direction showing the deep via 124 having the length $L_{124}$ extending in the first (X-axis) direction. The circuit interconnect 120 orthogonally abuts the deep via 124 at the interface 128. The interface 128 corresponds to a cross-section of the circuit interconnect 120, having a width $W_{120}$ in the first direction. FIG. 1B also shows an insulating layer 130 disposed on the PDN 104.

With further reference to FIG. 1B and also to FIG. 1C, it can be seen that the via 124 extends a distance $D_{102}$ in the third (Z-axis) direction (e.g., up) from a second die surface 134 to a first die surface 132 along the entire length $L_{124}$ of the via 124 in the X-axis direction. The circuit interconnect 120 is disposed on the first-type semiconductor region 108 and extends along the first die surface 132 to the deep via 124.

FIG. 1C is a cross-sectional side view at cross-section Y1C-Y1C' FIG. 1A through the source/drain regions 122A and 122B. FIG. 1C further shows that the second-type semiconductor region 106 and the first-type semiconductor region 108 both include stacks 136A and 136B of nanosheets of semiconductor material. Current in the source/drain regions 122A and 122B may be controlled by voltages applied to the channel regions 112A/114A and 112B/114B in FIG. 1A by the gates 110 and 116. FIG. 1D shows a side view of the transistor circuit 100 along cross-section Y1D-Y1D' in FIG. 1A which extends through the gate 116. The gate 116 may be coupled to other circuits by way of circuit interconnects and/or vias not shown here.

With further reference to FIG. 1C, the features of the transistor circuit 100 described above are formed in a die medium 138, which may include a dielectric material (e.g., silicon oxide) disposed on a semiconductor substrate, for example. Fabrication of the transistor circuit 100 includes forming the circuit interconnect 120 on the first-type semiconductor region 108 in the die medium 138. The circuit interconnect 120 may be formed of a conductive material 140, such as a metal (e.g., copper), and the process of forming includes etching a channel in the die medium 138 and filling the channel with the conductive material 140. To avoid migration of the conductive material 140 through the die medium 138, a barrier layer 142 is first formed on sides of the channel before deposition of the conductive material 140. Subsequently, the deep via 124 is formed in a similar manner, including etching a void in the die medium 138, depositing another barrier layer 144, and filling the void with the conductive material 140 to form the deep via 124. It should be understood that the circuit interconnect 120 and the deep via 124 may or may not be formed of a same conductive material 140. Using the above fabrication method, the deep via 124 may be coupled to circuit interconnects anywhere along the length $L_{124}$, such as to provide the supply voltage $V_{DD}$ or the reference voltage $V_{SS}$ to one of the channel regions 112A/112B and 114A/114B.

The barrier layers 142 and 144 are layers of high resistance material at the interface 128 and are disposed between the deep via 124 and the circuit interconnect 120 based on the fabrication method described above. The high resistance of the interface 128 causes a loss of power and reduces performance. Additionally, the deep via 124 formed in this manner develops a capacitance with respect to the channel regions 112B and 114B in the first-type semiconductor region 108. Because the deep via 124 extends up to the first die surface 132 along the entire length $L_{124}$, the deep via 124 is directly opposite to the channel regions 112B and 114B over a large area, separated by only the die medium 138. Even if this capacitance is small in an individual transistor circuit 100, reducing the total capacitance across thousands of transistor circuits 100 in the IC die 102 can be beneficial to improve performance and reduce power consumption.

Figures 2A, 2B, 2C, 2D:
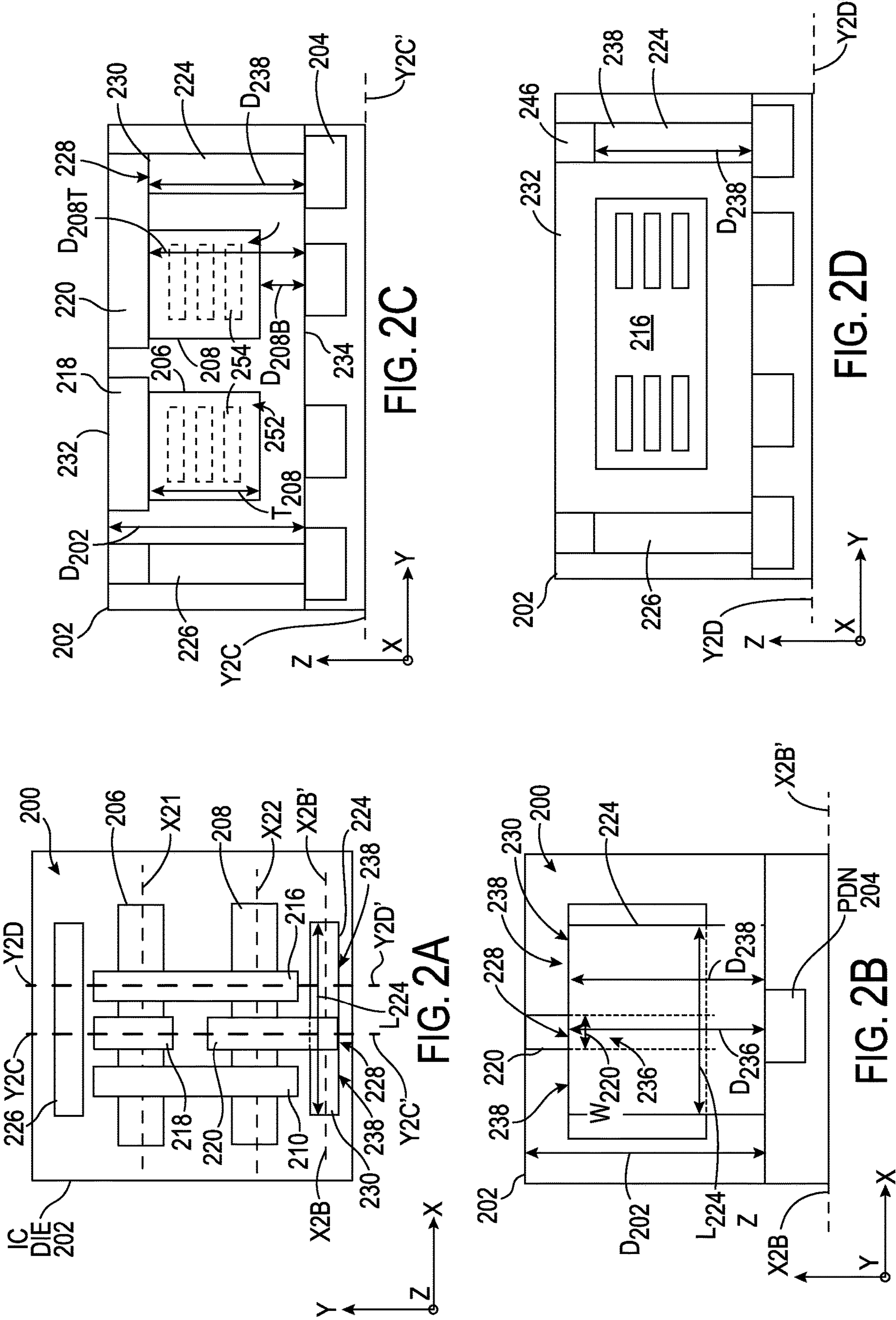
FIGS. 2A-2D are cross-sectional views along Z, Y, and X axes, respectively, of a first example of an exemplary transistor circuit on an exemplary IC die, including a deep via to couple a transistor circuit to a back-side power distribution network (PDN) wherein at least one region of the deep via is recessed below a first die surface.

FIGS. 2A-2D are views of a transistor cell circuit ("transistor circuit") 200 on an integrated circuit (IC) die 202 shown from each of the Z, Y, and X axes, respectively, corresponding to FIGS. 1A-1D. Some features of the transistor circuit 200 correspond to, and may be the same as, features of the transistor circuit 100 in FIGS. 1A-1D. FIG. 2A is an illustration of a cross-sectional top view of the transistor circuit 200. In particular, the transistor circuit 200 includes a second-type semiconductor region 206 and a first-type semiconductor region 208 that extend in the X-axis direction along longitudinal axes X21 and X22 corresponding to the second-type semiconductor region 106 and the first-type semiconductor region 108 in FIGS. 1A-1D. Also, the transistor circuit 200 includes gates 210 and 216 corresponding to the gates 110 and 116 in the transistor circuit 100.

The transistor circuit 200 further includes circuit interconnects 218 and 220 that respectively couple the second-type semiconductor region 206 to a deep via 226 and couple the first-type semiconductor region 208 to a deep via 224. The interconnects 218 and 220 and the deep via 224 may be formed of a same conductive material, such as a metal, which may be any of tungsten (W), cobalt (Co), ruthenium (Ru), and molybdenum (Mo), or the like. Bottom and side faces of the interconnects 218 and 220 and the deep via 224 may include a barrier layer, as discussed above, to reduce leakage currents. Unlike the circuit interconnect 120 in FIGS. 1A-1D, which extends along the first die surface 132 and abuts a side of the deep via 124 adjacent to the first die surface 132, the circuit interconnect 220 extends onto (e.g., above in the Z-axis direction) the deep via 224 and couples to an interface 228 on a top (e.g., horizontal) face 230 of the deep via 224. The deep via 224 ("via 224") is further coupled to a PDN 204, as shown more clearly in FIGS. 2B and 2C, which are cross-sectional side views in the Y-axis and X-axis directions, respectively. A side view along a cross-section X2B-X2B' extending in the X-axis direction is shown in FIG. 2B. Side views along cross-sections Y2C-Y2C' and Y2D-Y2D' extending in the Y-axis direction are shown in FIGS. 2C and 2D, respectively. Also shown in FIGS. 2B and 2C, the IC die 202 includes a first die surface 232 that extends in the first direction and the second (Y-axis) direction, and a second die surface 234 at a first distance $D_{202}$ from the first die surface 232 in the third direction. The transistor circuit 200 is disposed between the first die surface 232 and the second die surface 234. The IC die 202 also includes the PDN 204 disposed on the second die surface 234. The PDN 204 comprises interconnects (e.g., conductive traces) disposed on the second die surface 234 and coupled to a voltage source, such as a source of a supply voltage ($V_{DD}$) or a reference voltage ($V_{SS}$) (not shown), to distribute power for operation of the transistor 200 and other circuits on the IC die 202.

The via 224 has a length $L_{224}$ in the X-axis direction. Along the length $L_{224}$, the via 224 includes an interface region 236 corresponding to the interface 228, which comprises an area in which the via 224 couples to (e.g., is in contact with and may be in direct contact with) the circuit interconnect 220 to provide an electrical connection from the PDN 204 to the first-type semiconductor region 208. The via 224 also includes a non-interface region 238 on at least one side of the interface region 236 in the X-axis direction (e.g., along the length $L_{224}$). The non-interface region 238 is recessed below the first die surface 232 to extend a second distance $D_{238}$ in the Z-axis direction from the second die surface 234. The interface region 236, which includes the interface 228, extends a third distance $D_{236}$ in the Z-axis direction from the second die surface 234. The second distance $D_{238}$ may be the same as or less than the third distance $D_{236}$. A dielectric material 239 may be provided between the non-interface regions 238 (on either side of the interface region 236) and the first die surface 232. The dielectric material 239 may comprise any appropriate dielectric material, such as one or more of silicon dioxide (SiO2), silicon oxycarbide (SiOC), carbon doped oxide low-k (SiCOH), and hydrocarbons (CxHy), for example.

The circuit interconnect 220 extends in the Y-axis direction onto the via 224 creating the interface 228 on the top face 230, having a width $W_{220}$ in the first direction that may correspond to a width of the circuit interconnect 220. The circuit interconnect 220 extends between (e.g., directly between) the via 224 and the first die surface 232 and onto the via 224 (rather than abutting a side) because the interface region 236 of the via 224 extends only up the second distance $D_{236}$ from the second die surface 234 rather than the first distance $D_{202}$ (all the way up to the first die surface 232). The interface region 236 may have a width corresponding to the width $W_{220}$ of the interface 228 in the X-axis direction and extending the third distance $D_{238}$ in the Z-axis direction to the second die surface 234, at which point the via 224 couples to the PDN 204. In this example, the second distance $D_{238}$ to which the non-interface region 238 of the via 224 extends (from the second die surface 234) is the same as the third distance $D_{236}$ to which the interface region 236 extends from the second die surface 234.

The first-type semiconductor region 208 and the second-type semiconductor region 206 may comprise stacks 250 and 252, respectively, of nanosheets 254 of doped semiconductor material stacked in the third (Z-axis) direction and configured to conduct an electrical current in the first (X-axis) direction. The gates 210 and 216 may comprise metal gate material disposed around the nanosheets 254. FIG. 2C is an illustration of the cross-section Y2C-Y2C' shown in FIG. 2A, showing the first-type semiconductor region 208 and the second-type semiconductor region 206 may include dielectric material 256 (and other layers) disposed around the nanosheets 254. In the Z-axis direction, the first-type semiconductor region 208 and the second-type semiconductor region 206 have a thickness $T_{208}$ that extends from a fourth distance $D_{208B}$ from the second die surface 234 to a fifth distance $D_{208T}$ from the second die surface 234.

FIG. 2D is a side view of cross-section Y2D-Y2D', through the gate 216. A space 246 between the non-interface region 238 and the first die surface 232 in FIG. 2D may be filled with a dielectric or insulating material. The distance $D_{238}$ in the third direction may be in a range from twenty-five percent (25%) to seventy-five percent (75%) of the first distance $D_{202}$ from the second die surface 234 to the first die surface 232. By forming the via 224 such that the second distance $D_{238}$ and the third distance $D_{236}$ are less than the first distance $D_{202}$, the transistor circuit 200 is improved over the transistor circuit 100, for the following reasons. In this example, the second distance $D_{238}$ and the third distance $D_{236}$ are equal to the fifth distance $D_{208T}$.

Fabrication of the transistor circuit 200 involves forming the deep via 224 before forming the circuit interconnect 220. Barrier layers may be formed on the bottom and side faces of such trench before the trench is filled with conductive material, but a barrier layer would not be formed on the top face 230 until the circuit interconnect 220 is formed. The barrier layers may comprise a thin layer of titanium nitride (TiN), which may be less than one (1) nanometer in thickness, for example. Even though a barrier layer is later formed in a trench for the circuit interconnect 220 and on the top face 230 before the circuit interconnect 220 is formed, the interface 228 will have at least one fewer high resistance barrier layer (e.g., one layer instead of two) than when the interface to the via 224 is formed on a side face, which reduces the resistance of the interface 228 compared to the interface 128 of the transistor circuit 100 in FIGS. 1A-1D.

In another aspect, by having the via 224 extend the distances $D_{236}$ and $D_{238}$ from the second die surface 234, rather than extending the first distance $D_{202}$ from the second die surface 234 all the way to the first die surface 232, capacitance between the first-type semiconductor region 208 and the deep via 224 is reduced. Thus, the transistor circuit 200 has reduced losses and provides improved performance.

FIG. 3 is a flowchart of a method 300 of fabricating an IC die, such as the IC die 202 in FIGS. 2A-2D. The method includes forming a first die surface 232 extending in a first (X-axis) direction and a second (Y-axis) direction orthogonal to the first direction (block 302) and forming a second die surface 234 at a first distance $D_{202}$ from the first die surface 232 in a third (Z-axis) direction orthogonal to the first die surface (block 304). The method further includes forming a transistor circuit 200 between the first die surface 232 and the second die surface 234 and comprising a first-type semiconductor region 208 and a second-type semiconductor region 206 each extending in the first direction, a vertical interconnect access (via) 224 extending from the second die surface 234 in the third direction and having a length in the first direction, and a first circuit interconnect 220 to couple the first-type semiconductor region 208 to the via 224 (block 306). The method further includes forming a power distribution network 204 comprising an interconnect disposed on the second die surface 234, coupled to the via 224, and configured to provide power to the transistor circuit 200 (block 308), wherein the via 224 comprises an interface region 236 corresponding to an interface 228 of the via 224 and the first circuit interconnect 220, and a non-interface region 238 on at least one side of the interface region 236, in the first direction, and extending in the third direction from the second die surface 234 a second distance $D_{238}$ less than the first distance $D_{202}$.

Figures 4A, 4B, 4C, 4D:
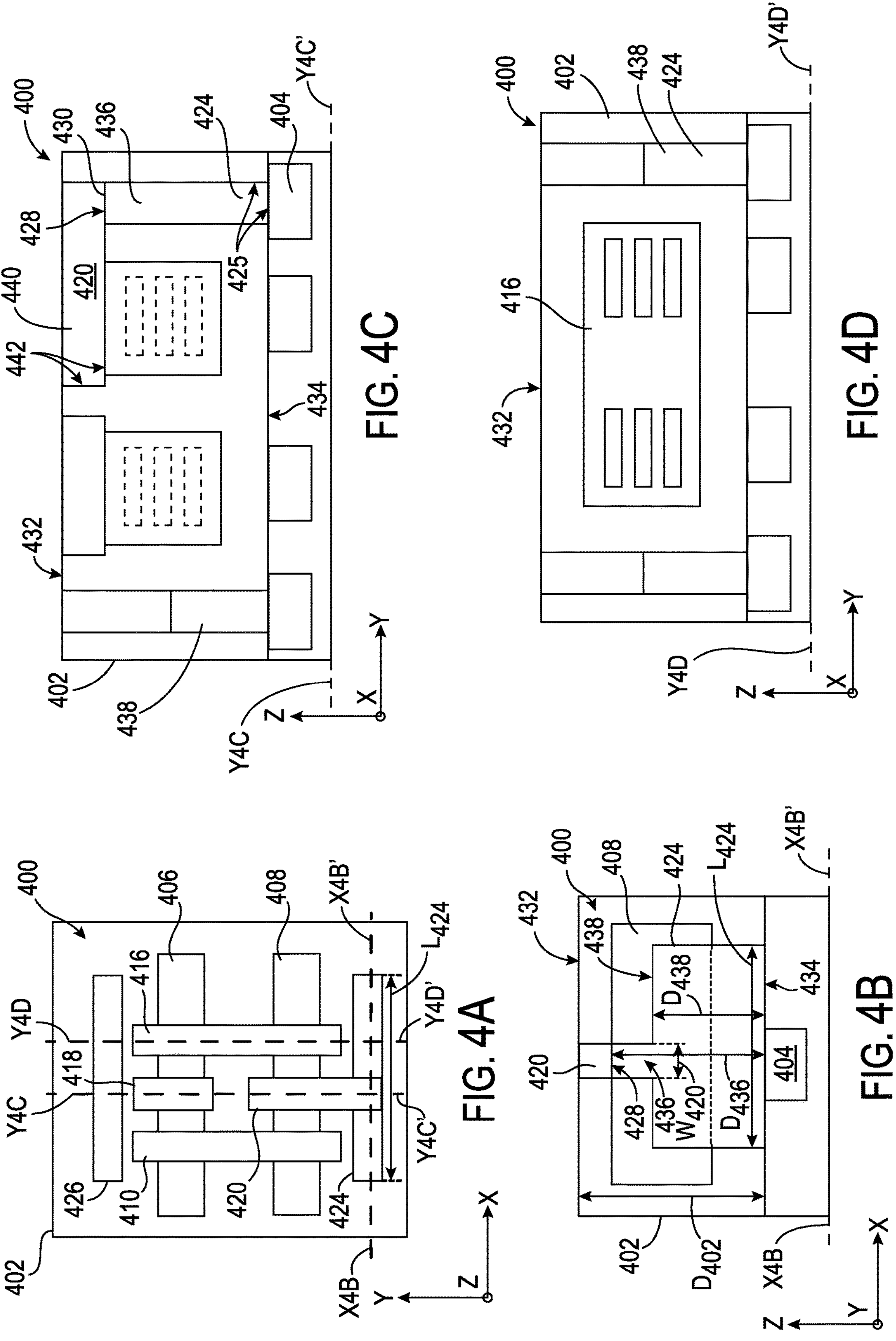
FIGS. 4A-4D are cross-sectional views along Z, Y, and X axes, respectively, of a second example of an exemplary transistor circuit on an exemplary IC die including a deep via to couple a transistor circuit to a back-side PDN wherein at least one region of the deep via is recessed below a first die surface.

FIGS. 4A-4D are views of another example of a transistor circuit 400 on an IC die 402 shown from directions of each of the Z, Y, and X axes, respectively, corresponding to FIGS. 1A-1D and 2A-2D. The illustration in FIG. 4A is a cross-sectional top view (e.g., in the Z-axis direction) of the transistor circuit 400. Some features of the transistor circuit 400 correspond to, and may be the same as, similar features of the transistor circuit 200 in FIGS. 2A-2D. FIG. 2A is an illustration of a cross-sectional top view of the transistor circuit 400. In particular, the transistor circuit 400 includes a PDN 404, a second-type semiconductor region 406, and a first-type semiconductor region 408 that correspond, respectively, to the PDN 204, the second-type semiconductor region 206, and the first-type semiconductor region 208 in FIGS. 2A-2D. Also, the transistor circuit 400 includes gates 410 and 416 corresponding to the gates 210 and 216 in the transistor circuit 200. The above features of the transistor circuit 400 corresponding to features in transistor circuit 200 are not described further except as needed. A side view along a cross-section X4B-X4B' extending in the X-axis direction is shown in FIG. 4B. Side views along cross-sections Y4C-Y4C' and Y4D-Y4D' extending in the Y-axis direction are shown in FIGS. 4C and 4D, respectively.

In FIG. 4A, a circuit interconnect 420 extends in the second direction onto a via 424 to electrically couple to the via 424 to provide a voltage from the PDN 404 to the first-type semiconductor region 408. The circuit interconnect 420 and the via 424 may be formed of a same conductive material, such as a metal. A barrier layer 425 may be formed on bottom and side faces of a recessed region before formation of the via 424. FIGS. 4B and 4C are side views along cross-sections Y4B-Y4B' and Y4C-Y4C', respectively, to show more clearly that the circuit interconnect 420 is disposed between the via 424 and a first die surface 432. The circuit interconnect 420 couples to the via 424 at an interface 428 on a top surface 430 of the via 424 in an interface region 436. The interface region 436 of the via 424 extends a third distance $D_{436}$ in the Z-axis direction from a second die surface 434 rather than all the way up to the first die surface 432. Then the circuit interconnect 420 may be formed between the via 424 and the first die surface 432. Since no barrier layer is formed on the top surface 430 during formation of the via 424, the interface 428 may have a reduced resistance, as discussed with regard to the interface 228 in FIGS. 2A-2D. The interface region 436 has a width $W_{420}$ in the X-axis direction corresponding to a width $W_{420}$ of the circuit interconnect 420. The interconnect 420 may be formed of a conductive material 440, such as a metal, such as W, Co, Ru, or Mo, for example. The circuit interconnect 420 may also include a barrier layer 442 that is formed before the conductive material 440 is added to reduce leakage currents. The barrier layer 442 may be, for example, a layer of titanium nitride (TiN), which may be less than one (1) nanometer in thickness.

Non-interface regions 438 of the via 424 (e.g., regions on either side of the interface 428 in the X-axis direction) may not couple to any circuit interconnects and, therefore, do not need to extend the same distance $D_{436}$ as the interface region 436 in the Z-axis direction. In this regard, the non-interface regions 438 may be described as shoulder regions on either side of the interface region 436, having a reduced height in the Z-axis direction compared to the interface region 436. Between the non-interface regions 438 and the first die surface 432 on each side of the interface region 436, dielectric materials may be formed or deposited in some manner. The dielectric materials may include any appropriate dielectric material, including one or more of SiO2, SiOC, SiCOH, and CxHy, for example.

In this example, the non-interface region 438 is recessed during the process of formation to extend a second (shorter) distance $D_{438}$ in the Z-axis direction from the second die surface 434. Over an entire length $L_{424}$ of the via 424, in this example, only the interface region 436 extends the distance $D_{436}$ from the second die surface 434 to the circuit interconnect 420. For this reason, the via 424 has reduced capacitance to the first-type semiconductor region 408. In other examples, the via 424 may include one or more other interface regions (not shown) coupled to circuit interconnects but would still have non-interface regions that are recessed to reduce capacitance. The side view in FIG. 4D shows the cross-section Y4D-Y4D' in FIG. 4A.

Figures 5A, 5B, 5C, 5D:
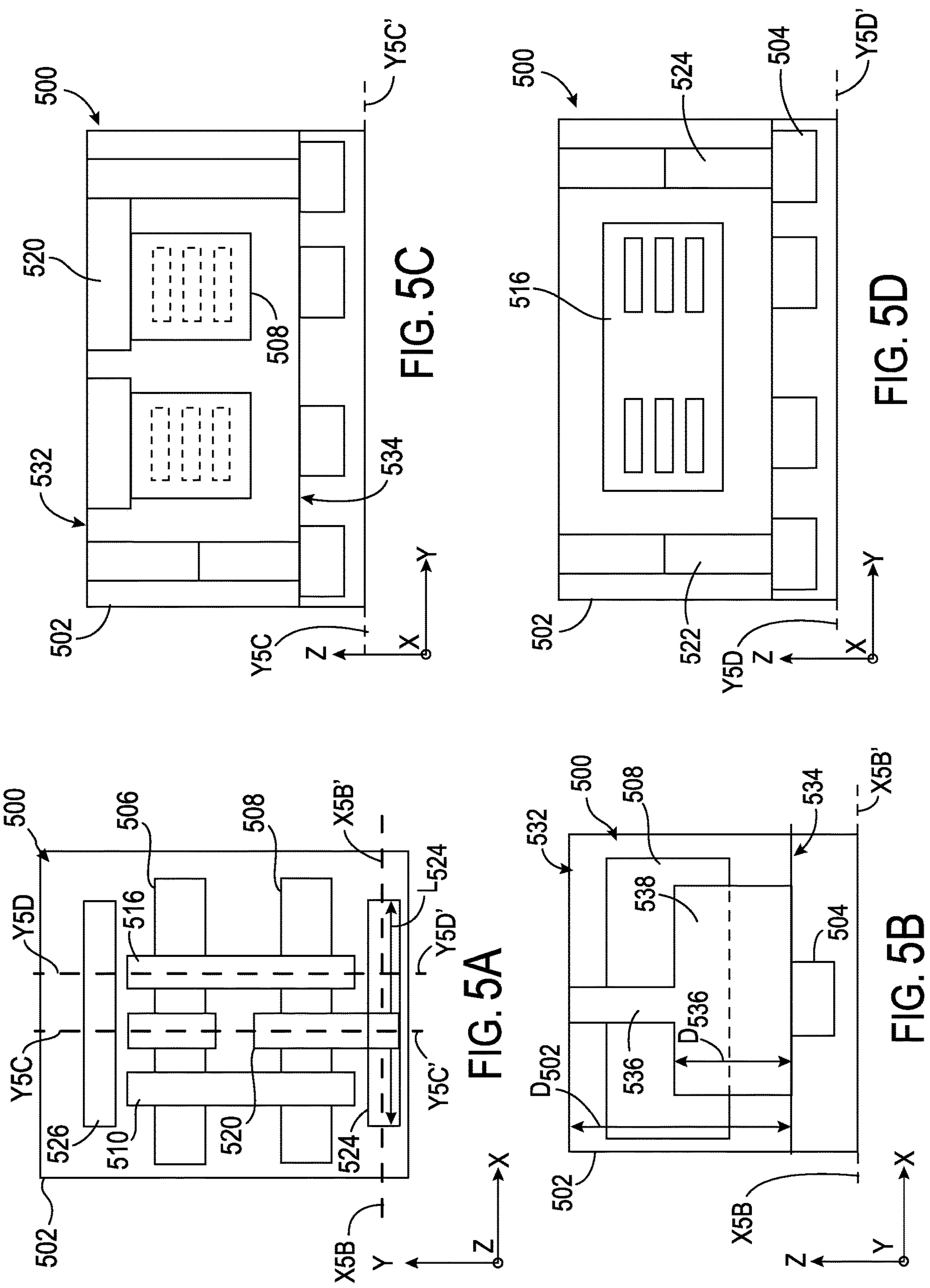
FIGS. 5A-5D are cross-sectional views along Z, Y, and X axes, respectively, of a third example of an exemplary transistor circuit on an exemplary IC die including a deep via to couple a transistor circuit to a back-side PDN wherein at least one region of the deep via is recessed to below a first die surface.

FIGS. 5A-5D are views of another example of a transistor circuit 500 on an IC die 502 shown from each of the X, Y, and Z axes corresponding to FIGS. 1A-1D, 2A-2D, and 4A-4D. The illustration in FIG. 5A is a cross-sectional top view of the transistor circuit 500. Some features of the transistor circuit 500 correspond to, and may be the same as, similar features of the transistor circuit 200 in FIGS. 2A-2D. In particular, the transistor circuit 500 includes a PDN 504, a second-type semiconductor region 506, and a first-type semiconductor region 508 that correspond, respectively, to the PDN 204, the second-type semiconductor region 206, and the first-type semiconductor region 208 in FIGS. 2A-2D. Also, the transistor circuit 500 includes gates 510 and 516 corresponding to the gates 210 and 216 in the transistor circuit 200. The above features of the transistor circuit 500 are not described further except as needed. A side view along a cross-section X5B-X5B' extending in the X-axis direction is shown in FIG. 5B. Side views along cross-sections Y5C-Y5C' and Y5D-Y5D' extending in the Y-axis direction are shown in FIGS. 5C and 5D, respectively.

In FIG. 5A, a circuit interconnect 520 extends in the second (Y-axis) direction along a first die surface 532 and abuts or couples to (a side of) a via 524 at an interface 528, as in the example in FIGS. 1A-1C. FIG. 5B is a side view of the cross-section Y5B-Y5B', showing an interface region 536 corresponding to the interface 528 extending (in the Z-axis direction) between a second die surface 534 and the first die surface 532 to provide a voltage from the PDN 504 to the circuit interconnect 520. A distance $D_{536}$ to which the via 524 extends above the second die surface 534 in the interface region 536 in this example is equal to the distance $D_{502}$ between the first die surface 532 and the second die surface 534. For this reason, the interface 528 in the interface region 536 is similar to the interface 128 in the interface region 136 in FIGS. 1A-1D. Therefore, the interface 528 may not provide a reduced resistance.

However, unlike the via 124, non-interface regions 538 of the via 524 do not extend (in the Z-axis direction) up to the first die surface 532. Over the length $L_{524}$ of the via 524, only the interface region 536 extends the distance $D_{502}$. The non-interface regions 538 are recessed to extend a shorter distance $D_{538}$, which is less than that of the interface region 536. Therefore, capacitance between the via 524 and the gates 510 and 516 may be reduced. The side views at the cross-sections Y5C-Y5C' in FIG. 5C and Y5D-Y5D' in FIG. 5D show that the via 522 extends the distance $D_{538}$ in the Z-axis direction, which is less than the distance $D_{502}$ between the second die surface 534 and the first die surface 532, to reduce capacitance with the gates 510 and 516.

Figures 6A, 6B, 6C, 6D:
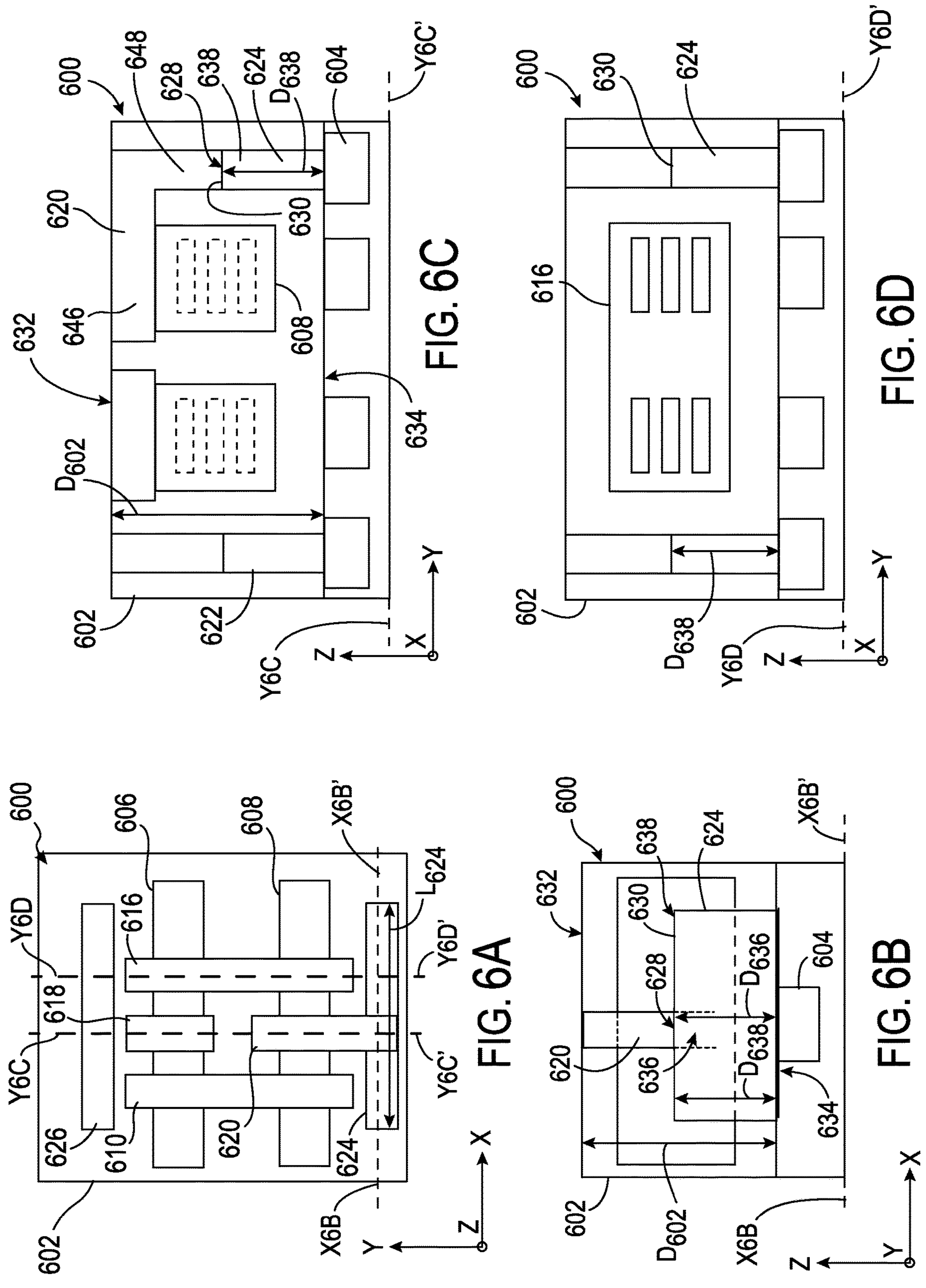
FIGS. 6A-6D are cross-sectional views along respective axes of a fourth example of an exemplary transistor circuit on an exemplary IC die, including a deep via to couple a transistor circuit to a back-side PDN wherein at least one region of the deep via is recessed below a first die surface.

FIGS. 6A-6D are views of another example of a transistor circuit 600 on an IC die 602 shown from each of the X, Y, and Z axes corresponding to FIGS. 1A-1D, 2A-2D, 4A-4D, and 5A-5D. Some features of the transistor circuit 600 correspond to, and may be the same as, similar features of the transistor circuit 200 in FIGS. 2A-2D. In particular, the transistor circuit 600 includes a PDN 604, a second-type semiconductor region 606, and a first-type semiconductor region 608 that correspond, respectively, to the PDN 204, the second-type semiconductor region 206, and the first-type semiconductor region 208 in FIGS. 2A-2D. Also, the transistor circuit 600 includes gates 610 and 616 corresponding to the gates 210 and 216 in the transistor circuit 200. The above features of the transistor circuit 600 are not described further except as needed. A side view along a cross-section X6B-X6B' extending in the X-axis direction is shown in FIG. 6B. Side views along cross-sections Y6C-Y6C' and Y6D-Y6D' extending in the Y-axis direction are shown in FIGS. 6C and 6D, respectively.

In FIG. 6A, a circuit interconnect 620 extends in the Y-axis direction over a top surface 630 of a via 624, which is further coupled to the PDN 604 to provide a voltage (e.g., supply voltage $V_{DD}$ or reference voltage $V_{SS}$) to the first-type semiconductor region 608. The interconnect 620 may be formed of a conductor, such as a metal, such as copper, for example.

As shown in FIGS. 6B and 6C, at cross-sections Y6B-Y6B' and Y6C-Y6C', respectively, a non-interface region 638 of the via 624 extends a distance $D_{638}$ in the Z-axis direction from a second die surface 634. The via 624 is recessed below a first die surface 632, such that the non-interface region 638 extends a shorter distance $D_{638}$ from the second die surface 634 than a distance $D_{602}$ from the second die surface 634 to the first die surface 632. In this example, a distance $D_{636}$ to which an interface region 636 extends in the Z-axis direction is the same as the distance $D_{638}$. To couple the circuit interconnect 620 to the via 624, the circuit interconnect 620 includes a first metal segment 646 that extends along a longitudinal axis Y6C in the Y-axis direction at a first die surface 632 and a second metal segment 648 that extends along a longitudinal axis Z6 to the via 624. In this context, a "segment" of the circuit interconnect 620 refers to a conductive portion extending linearly in a direction along a longitudinal axis and where electrical current through the "segment" will primarily move in the direction along the longitudinal axis.

The second metal segment 648 extends in the Z-axis direction from the first metal segment 646 to couple the first metal segment 646 to a top surface 630 of the via 624 at an interface 628. Thus, the interface 628 may not include a barrier layer 642 that is formed with the via 624, and therefore may have improved resistance. In addition, because the distances $D_{638}$ and $D_{636}$ are less than the distance $D_{602}$, there is reduced capacitance between the via 624 and the first-type semiconductor region 608. FIG. 6D is a side view of the cross-section Y6D-Y6D' showing that the via 622 also extends only the distance $D_{638}$ in the Z-axis direction, to provide a reduced capacitance to the second-type semiconductor region 606.

Figures 7B, 8B:
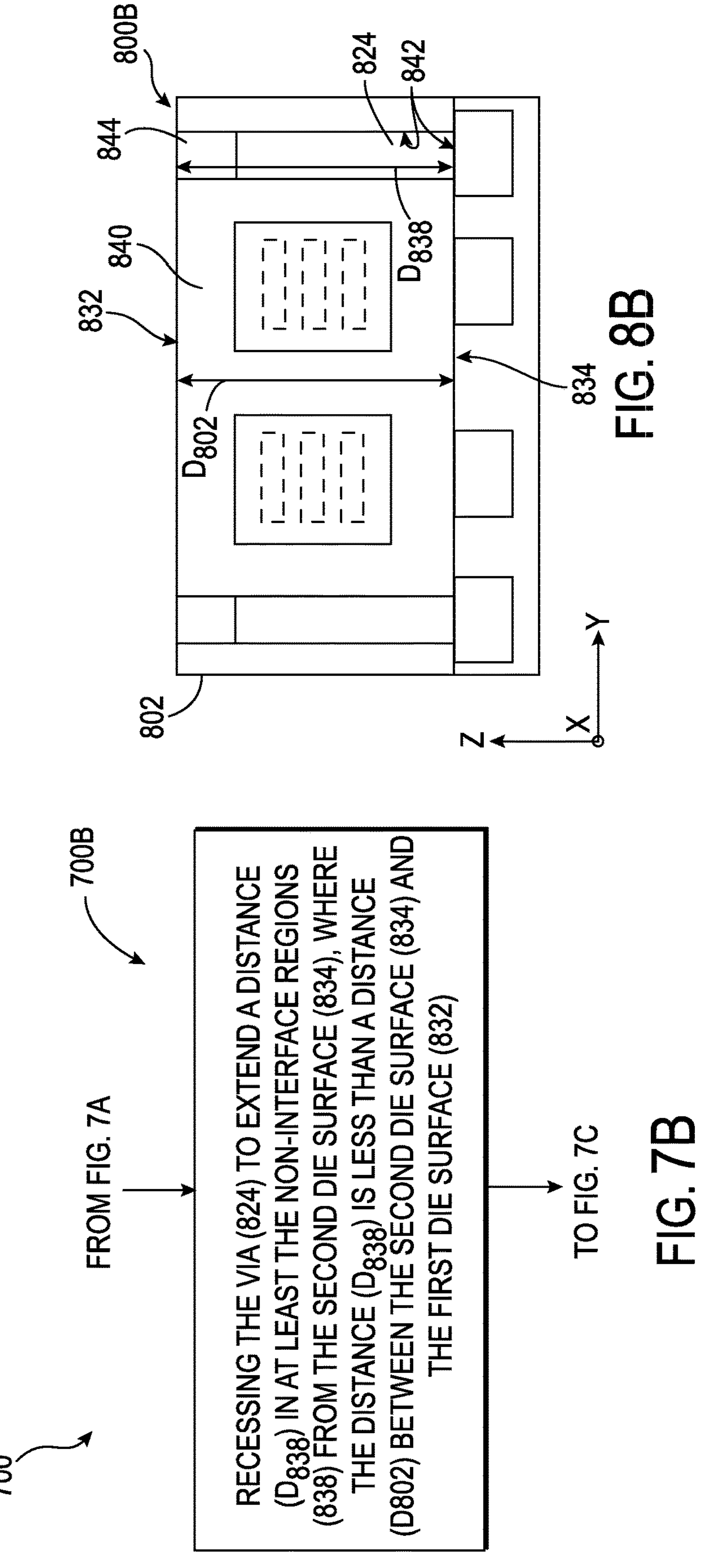
Figure 7C:
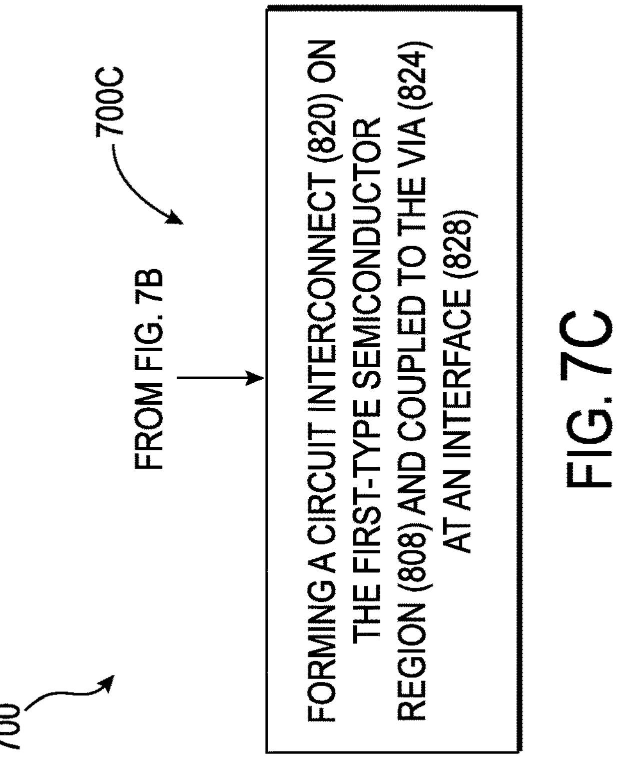

In this regard, FIGS. 7A-7C are a flowchart illustrating another exemplary fabrication process 700 for fabricating an IC die 802, including a through-die via to couple a first-type semiconductor region of a transistor circuit to a back-side power distribution network, wherein at least one region of the through-die via is recessed to extend a distance in the Z-axis direction that is less than a distance between a first die surface and a second die surface, including but not limited to the IC dies 102, 202, 402, 502, and 602 in FIGS. 1A-1D, 2A-2D, 4A-4D, 5A-5D, and 6A-6D.

Figure 8C:
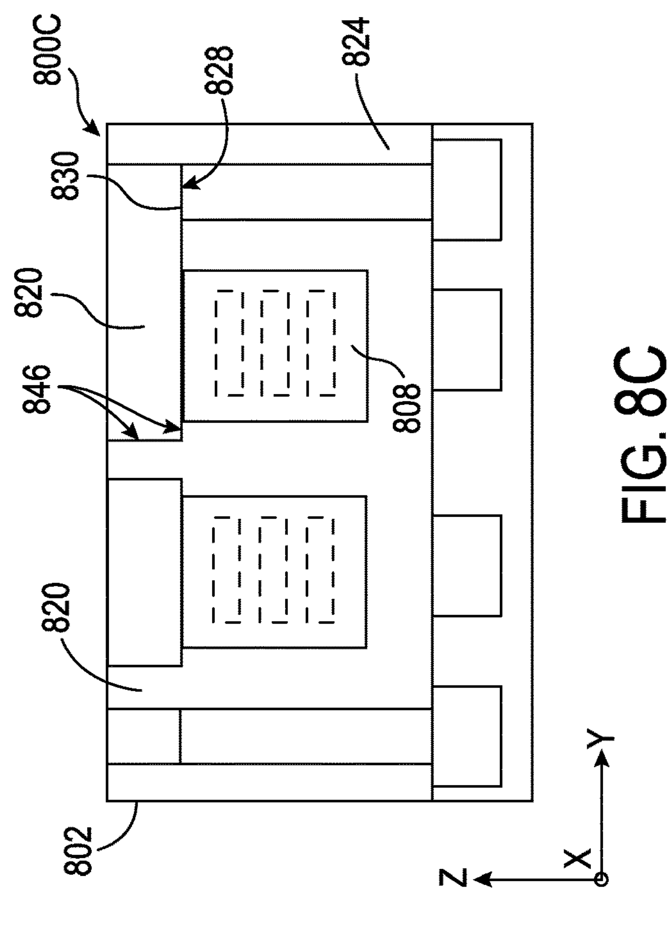

FIGS. 8A-8C show exemplary fabrication stages 800A-800C during fabrication of the IC die 802, including a through-die via to couple a second-type semiconductor region of a transistor circuit to a back-side power distribution network, wherein at least one region of the through-die via is recessed to extend less than the distance between a first die surface and a second die surface, according to the fabrication process 700 in FIGS. 7A-7C.

In this regard, as shown in the fabrication stage 800A in FIG. 8A, a first step 700A in the fabrication process 700 includes forming a first IC die 802 comprising a first die surface 832 extending in a first (X-axis) direction and a second (Y-axis) direction orthogonal to the first direction and a second die surface 834 at a first distance from the first die surface 832 in a third direction orthogonal to the first die surface 832, forming a transistor circuit 804 between the first die surface 832 and the second die surface 834, and comprising a first-type semiconductor region 808 and a second-type semiconductor region 806 each extending in the first direction, and a via 824 extending from the second die surface 834 in the third direction and having a length $L_{824}$ in the first direction. The transistor circuit 804 is formed in a dielectric medium 840, which may comprise a semiconductor substrate and/or a dielectric medium 840, such as an inter-layer dielectric (ILD). Forming the via 824 may include etching the dielectric medium 840 and forming a barrier layer 842, which may comprise titanium nitride (TiN), for example, on bottom and side surfaces of an etched region before depositing a conductive metal 825 for the via 824.

As shown in the fabrication stage 800B in FIG. 8B, a second step 700B in the fabrication process 700 includes recessing the via 824 to reduce the distance $D_{838}$ from the second die surface 834 in at least the non-interface regions 838, such that the distance $D_{838}$ is less than a distance $D_{802}$ between the second die surface 834 and the first die surface 832. A dielectric material 844 may be added in the recessed areas between the non-interface regions 838 and the first die surface 832. In some examples, the dielectric material 844 may comprise any of SiO2, SiOC, SiCOH, and CxHy, formed on the recessed via 824.

As shown in the fabrication stage 800C in FIG. 8C, a third step 700C in the fabrication process 700 includes forming a circuit interconnect 820 on the first-type semiconductor region 808 and coupled to the via 824 at an interface 828. The dielectric medium 840 and/or the dielectric material 844 (FIG. 8B) may be etched or otherwise shaped for the circuit interconnect 820. Before formation of the circuit interconnect 820, a barrier layer (e.g., TiN) 846 may be formed on the bottom and side faces of the recessed area. In some examples, the circuit interconnect 820 couples to the interface 828 on a top surface 830 of the via 824 to provide a lower resistance between the via 824 and the circuit interconnect 820.

Electronic devices, according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 9:
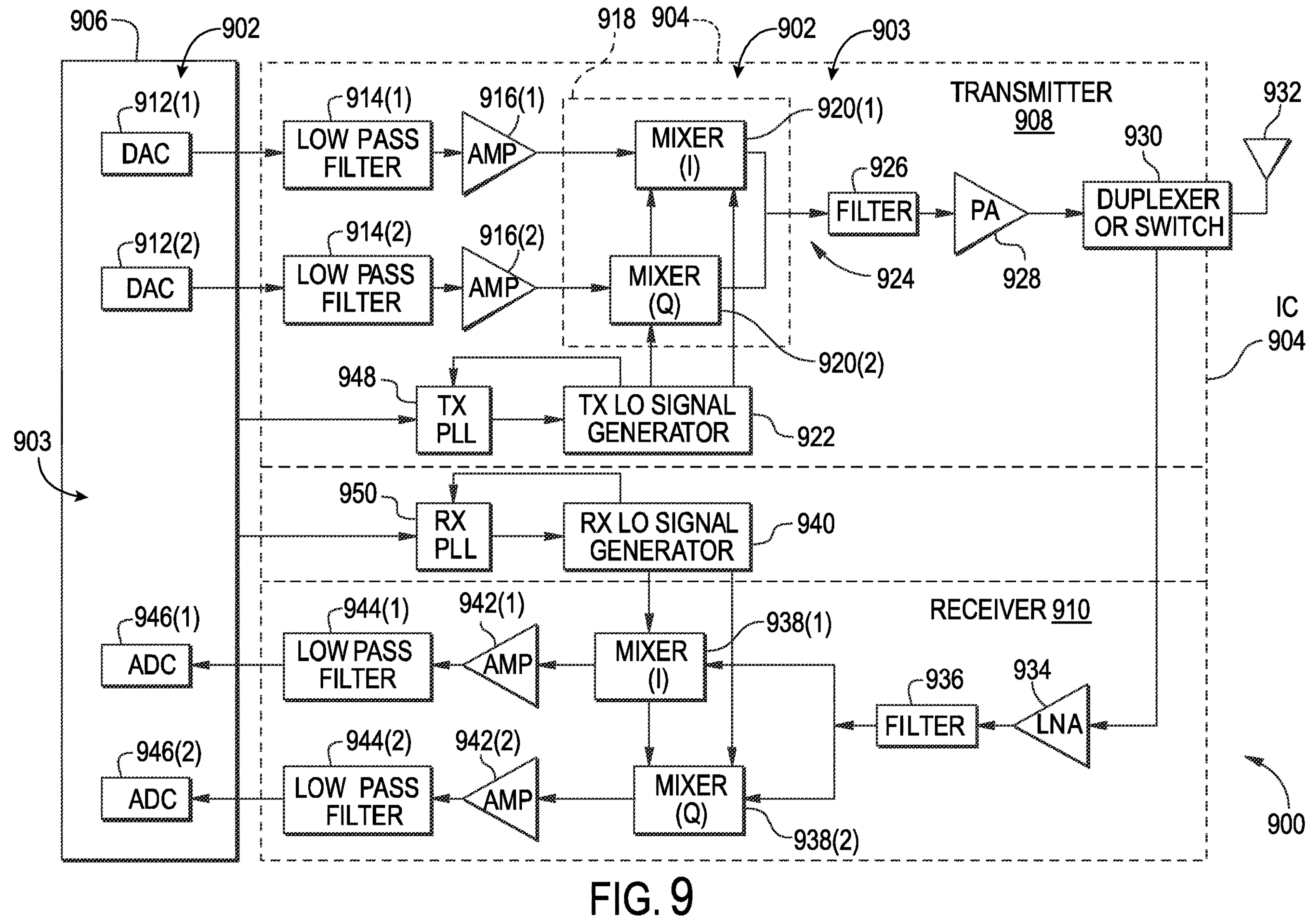
FIG. 9 is a block diagram of an exemplary transistor circuit on an exemplary IC die including a deep via to couple a transistor circuit to a back-side PDN wherein at least one region of the deep via is recessed below a first die surface as illustrated in FIGS. 2A-2D, 4A-4D, 5A-5D, and 6A-6D and according to, but not limited to, any of the exemplary fabrication processes in FIGS. 3 and 7A-7C.

In this regard, FIG. 9 illustrates a block diagram of an exemplary wireless communications device 900 that includes radio frequency (RF) components formed from one or more ICs 902, wherein the communications device 900 may include the IC die 202 in FIGS. 2A-2D, including a deep via coupling a transistor circuit on a front side to a power distribution network on a back side, where the deep via includes an interface region coupled to a circuit interconnect, and a non-interface region that is recessed to have reduced capacitance and may have reduced resistance, such as any of the IC dies 202, 402, 502, and 602 in FIGS. 2A-2D, 4A-4D, 5A-5D, and 6A-6D. The wireless communications device 900 may include or be provided as examples in any of the above-referenced devices. As shown in FIG. 9, the wireless communications device 900 includes a transceiver 904 and a data processor 906. The data processor 906 may include a memory to store data and program codes. The transceiver 904 includes a transmitter 908 and a receiver 910, which support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion and noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
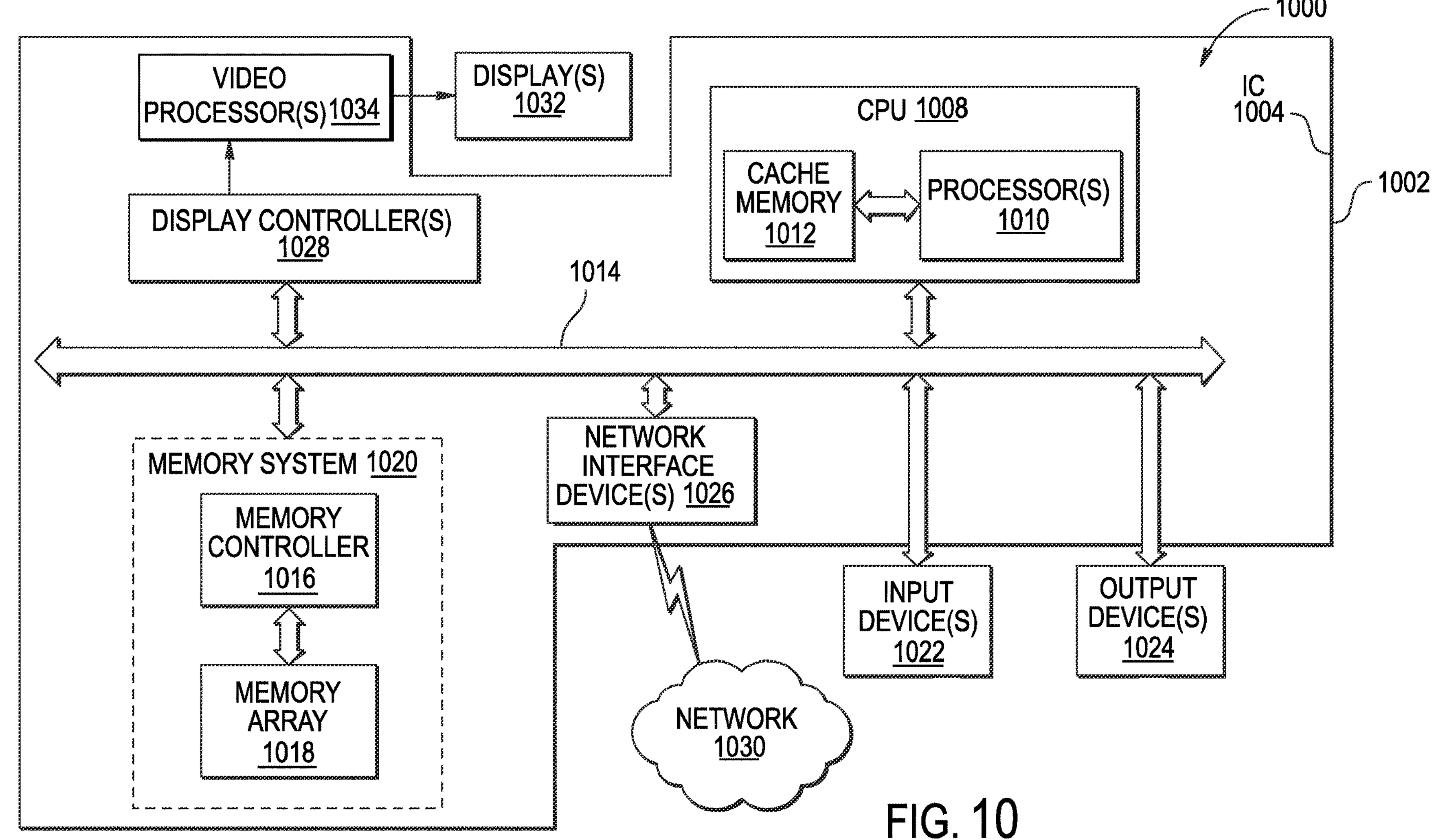
FIG. 10 is a block diagram of an exemplary wireless communication device that includes radio-frequency (RF) components that can include an exemplary transistor circuit on an exemplary IC die including a deep via to couple a transistor circuit to a back-side PDN wherein at least one region of the deep via is recessed below a first die surface as illustrated in FIGS. 2A-2D, 4A-4D, 5A-5D, and 6A-6D and according to, but not limited to, any of the exemplary fabrication processes in FIGS. 3 and 7A-7C.

FIG. 10 illustrates a block diagram of an example of a processor-based system 1000 that may be implemented on the IC die 202 in FIGS. 2A-2D, including a deep via coupling a transistor circuit on a front side to a power distribution network on a back side, where the deep via includes an interface region coupled to a circuit interconnect, and a non-interface region that is recessed to have reduced capacitance and may have reduce resistance, such as any of the IC dies 202, 402, 502, and 602 in FIGS. 2A-2D, 4A-4D, 5A-5D, and 6A-6D. In this example, the processor-based system 1000 includes a processor 1002 that includes an IC 1004 including one or more central processor units (CPUs) 1008, which may also be referred to as CPU or processor cores, each including one or more processors 1010. The CPU(s) 1008 may have cache memory 1012 coupled to the processor(s) 1002 for rapid access to temporarily stored data. The CPU(s) 1008 is coupled to a system bus 1014 and can intercouple master and slave devices included in the processor-based system 1000. As is well known, the CPU(s) 1008 communicates with these other devices by exchanging address, control, and data information over the system bus 1014. For example, the CPU(s) 1008 can communicate bus transaction requests to a memory controller 1016 as an example of a slave device. Although not illustrated in FIG. 10, multiple system buses 1014 could be provided wherein each system bus 1014 constitutes a different fabric.

Other master and slave devices can be connected to the system bus 1014. As illustrated in FIG. 10, these devices can include a memory system 1020 that includes the memory controller 1016 and one or more memory arrays 1018, one or more input devices 1022, one or more output devices 1024, one or more network interface devices 1026, and one or more display controllers 1028, as examples. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow an exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU(s) 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display(s) 1032 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. An integrated circuit (IC) die comprising:

a first die surface extending in a first direction and a second direction orthogonal to the first direction;

a second die surface at a first distance from the first die surface in a third direction orthogonal to the first die surface;

a transistor circuit between the first die surface and the second die surface, and comprising:

a first-type semiconductor region and a second-type semiconductor region, each extending in the first direction;

a vertical interconnect access (via) extending from the second die surface in the third direction and having a length in the first direction; and a first interconnect coupling the first-type semiconductor region to the via; and a power distribution network comprising an interconnect disposed on the second die surface, coupled to the via, and configured to provide power to the transistor circuit;

wherein the via comprises:

an interface region at an interface of the via and the first interconnect; and a non-interface region on at least one side of the interface region in the first direction and extending in the third direction from the second die surface a second distance less than the first distance.

2. The IC die of clause 1, wherein the first interconnect is disposed between, in the third direction, the first die surface and the interface region of the via.

3. The IC die of clause 1 or clause 2, wherein:

the interface region of the via extends a third distance in the third direction from the second die surface; and the second distance is less than the third distance.

4. The IC die of clause 1 or clause 2, wherein:

the interface region of the via extends a third distance in the third direction from the second die surface; and the second distance is equal to the third distance.

5. The IC die of any of clause 1, clause 2 or clause 4, wherein the first interconnect comprises a first metal segment extending in the first direction and a second metal segment extending in the third direction from the first metal segment to the via.

6. The IC die of clause 1, wherein:

the interface region of the via extends a third distance in the third direction from the second die surface; and the third distance is equal to the first distance.

7. The IC die of any of clause 1 to clause 6, wherein the second distance is in a range from twenty-five percent (25%) to seventy-five percent (75%) of the first distance.

8. The IC die of any of clause 3 to clause 5, wherein:

a thickness of the first-type semiconductor region in the third direction extends between a fourth distance from the second die surface and the first interconnect at a fifth distance from the second die surface; and the third distance is equal to the fifth distance.

9. The IC die of clause 8, wherein the second distance is in a range from the fourth distance to the fifth distance.

10. The IC die of any of clause 1 to clause 9, wherein:

the first-type semiconductor region comprises a first stack of nanosheets extending in the first direction, stacked in the third direction, and having a first-type doping; and the second-type semiconductor region comprises a second stack of nanosheets extending in the first direction, stacked in the third direction, and having a second-type doping.

11. The IC die of any of clause 1 to clause 10, wherein a thickness of the via in the second direction is in a range from ten (10) microns to twenty-five (25) microns.

12. The IC die of clause 11, wherein a ratio of the second distance to the thickness of the via is greater than four to one (4:1).

13. The IC die of any of clause 1 to clause 12 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

14. A method of fabricating an integrated circuit (IC) die, the method comprising:

forming a first die surface extending in a first direction and a second direction orthogonal to the first direction;

forming a second die surface at a first distance from the first die surface in a third direction orthogonal to the first die surface;

forming a transistor circuit between the first die surface and the second die surface and comprising:

a first-type semiconductor region and a second-type semiconductor region each extending in the first direction;

a vertical interconnect access (via) extending from the second die surface in the third direction and having a length in the first direction; and a first interconnect configured to couple the first-type semiconductor region to the via; and forming a power distribution network comprising an interconnect disposed on the second die surface, coupled to the via, and configured to provide power to the transistor circuit;

wherein the via comprises:

an interface region corresponding to an interface of the via and the first interconnect; and a non-interface region on at least one side of the interface region in the first direction and extending in the third direction from the second die surface a second distance less than the first distance.

15. The method of clause 14, further comprising forming the first interconnect between, in the third direction, the first die surface and the interface region of the via.

16. The method of clause 14 or clause 15, forming the via further comprising forming the interface region to extend a third distance in the third direction from the second die surface, wherein the second distance is less than the third distance.

17. The method of clause 14 or clause 15, forming the via further comprising forming the interface region to extend a third distance in the third direction from the second die surface, wherein the second distance is equal to the third distance.

18. The method of any of clause 14, clause 15, or clause 17 forming the first interconnect further comprising forming a first segment extending in the first direction and a second segment extending in the third direction from the first segment to the via.

19. The method of clause 14 or clause 15, further comprising:

forming the interface region of the via to extend a third distance in the third direction from the second die surface;

wherein the third distance is equal to the first distance.

20. The method of any of clause 14 to clause 17, further comprising forming the first-type semiconductor region to have a thickness extending between a fourth distance in the third direction from the second die surface and a fifth distance from the second die surface, wherein the interface region extends a third distance in the third direction from the second die surface and the third distance is equal to the fifth distance.

What is claimed is:

1. An integrated circuit (IC) die comprising:

a first die surface extending in a first direction and a second direction orthogonal to the first direction;

a second die surface at a first distance from the first die surface in a third direction orthogonal to the first die surface;

a transistor circuit between the first die surface and the second die surface, and comprising:

a first-type semiconductor region and a second-type semiconductor region, each extending in the first direction;

a vertical interconnect access (via) extending from the second die surface in the third direction and having a length in the first direction; and a first interconnect coupling the first-type semiconductor region to the via; and a power distribution network comprising an interconnect disposed on the second die surface, coupled to the via, and configured to provide power to the transistor circuit;

wherein the via comprises:

an interface region at an interface of the via and the first interconnect; and a non-interface region on at least one side of the interface region in the first direction and extending in the third direction from the second die surface a second distance less than the first distance.

2. The IC die of claim 1, wherein the first interconnect is disposed between, in the third direction, the first die surface and the interface region of the via.

3. The IC die of claim 2, wherein:
the interface region of the via extends a third distance in the third direction from the second die surface; and
the second distance is less than the third distance.

4. The IC die of claim 2, wherein:
the interface region of the via extends a third distance in the third direction from the second die surface; and
the second distance is equal to the third distance.

5. The IC die of claim 1, wherein the first interconnect comprises a first metal segment extending in the first direction and a second metal segment extending in the third direction from the first metal segment to the via.

6. The IC die of claim 1, wherein:
the interface region of the via extends a third distance in the third direction from the second die surface; and
the third distance is equal to the first distance.

7. The IC die of claim 1, wherein the second distance is in a range from twenty-five percent (25%) to seventy-five percent (75%) of the first distance.

8. The IC die of claim 3, wherein:
a thickness of the first-type semiconductor region in the third direction extends between a fourth distance from the second die surface and the first interconnect at a fifth distance from the second die surface; and
the third distance is equal to the fifth distance.

9. The IC die of claim 8, wherein the second distance is in a range from the fourth distance to the fifth distance.

10. The IC die of claim 1, wherein:
the first-type semiconductor region comprises a first stack of nanosheets extending in the first direction, stacked in the third direction, and having a first-type doping; and
the second-type semiconductor region comprises a second stack of nanosheets extending in the first direction, stacked in the third direction, and having a second-type doping.

11. The IC die of claim 1, wherein a thickness of the via in the second direction is in a range from ten (10) microns to twenty-five (25) microns.

12. The IC die of claim 11, wherein a ratio of the second distance to the thickness of the via is greater than four to one (4:1).

13. The IC die of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

14. A method of fabricating an integrated circuit (IC) die, the method comprising:
forming a first die surface extending in a first direction and a second direction orthogonal to the first direction;
forming a second die surface at a first distance from the first die surface in a third direction orthogonal to the first die surface;
forming a transistor circuit between the first die surface and the second die surface and comprising:
a first-type semiconductor region and a second-type semiconductor region each extending in the first direction;
a vertical interconnect access (via) extending from the second die surface in the third direction and having a length in the first direction; and
a first interconnect configured to couple the first-type semiconductor region to the via; and
forming a power distribution network comprising an interconnect disposed on the second die surface, coupled to the via, and configured to provide power to the transistor circuit;
wherein the via comprises:
an interface region corresponding to an interface of the via and the first interconnect; and
a non-interface region on at least one side of the interface region in the first direction and extending in the third direction from the second die surface a second distance less than the first distance.

15. The method of claim 14, further comprising forming the first interconnect between, in the third direction, the first die surface and the interface region of the via in the third direction.

16. The method of claim 15, forming the via further comprising forming the interface region to extend a third distance in the third direction from the second die surface, wherein the second distance is less than the third distance.

17. The method of claim 15, forming the via further comprising forming the interface region to extend a third distance in the third direction from the second die surface, wherein the second distance is equal to the third distance.

18. The method of claim 14, forming the first interconnect further comprising forming a first segment extending in the first direction and a second segment extending in the third direction from the first segment to the via.

19. The method of claim 14, further comprising:
forming the interface region of the via to extend a third distance in the third direction from the second die surface;
wherein the third distance is equal to the first distance.

20. The method of claim 14, further comprising forming the first-type semiconductor region to have a thickness extending between a fourth distance in the third direction from the second die surface and a fifth distance from the second die surface, wherein the interface region extends a third distance in the third direction from the second die surface and the third distance is equal to the fifth distance.

* * * * *